(12) United States Patent
Datta et al.

(10) Patent No.: US 11,500,615 B2
(45) Date of Patent: Nov. 15, 2022

(54) PROGRAMMABLE PSEUDO-RANDOM SEQUENCE GENERATOR FOR USE WITH UNIVERSAL LIDAR AND ITS ASSOCIATED METHOD OF OPERATION

(71) Applicant: Discovery Semiconductors, Inc., Ewing, NJ (US)

(72) Inventors: Shubhashish Datta, Ewing, NJ (US); Abhay M. Joshi, Ewing, NJ (US)

(73) Assignee: Discovery Semiconductors, Inc., Ewing, NJ (US)

( * ) Notice: Subject to any disclaimer, the term of this patent is extended or adjusted under 35 U.S.C. 154(b) by 296 days.

(21) Appl. No.: 16/866,532

(22) Filed: May 4, 2020

(65) Prior Publication Data

US 2020/0356346 A1 Nov. 12, 2020

Related U.S. Application Data

(60) Provisional application No. 62/845,278, filed on May 8, 2019.

(51) Int. Cl.
*H03K 3/00* (2006.01)
*G06F 7/58* (2006.01)
*G11C 19/00* (2006.01)
*G01S 7/484* (2006.01)
*H03K 3/84* (2006.01)

(52) U.S. Cl.
CPC .............. *G06F 7/584* (2013.01); *G01S 7/484* (2013.01); *G11C 19/00* (2013.01); *H03K 3/84* (2013.01)

(58) Field of Classification Search
None
See application file for complete search history.

(56) References Cited

U.S. PATENT DOCUMENTS

| | | | |
|---|---|---|---|
| 4,023,026 | A | 5/1977 | O'Farrell |
| 4,042,925 | A | 8/1977 | Albanese et al. |
| 4,638,494 | A | 1/1987 | Kartchner et al. |
| 4,901,082 | A | 2/1990 | Schreiber et al. |
| 5,497,160 | A | 3/1996 | Koehler et al. |
| 5,519,736 | A | 5/1996 | Ishida |
| 5,999,119 | A | 12/1999 | Carnes et al. |
| 6,079,007 | A | 6/2000 | Emery et al. |
| 6,271,786 | B1 | 8/2001 | Huff et al. |

(Continued)

FOREIGN PATENT DOCUMENTS

EP 0 938 192 8/1999

*Primary Examiner* — Tuan T Lam
(74) *Attorney, Agent, or Firm* — LaMorte & Associates P.C.

(57) ABSTRACT

A pseudo-random sequence generator for use within a universal lidar system and its corresponding method of operation. The pseudo-random sequence generator uses synchronized shift registers that are in series Binary adders are provided. The signal output of each of the shift registers is tapped and directed to the binary adders. High-speed switches are provided between the shift registers and the binary adders. The switches are programmed to connect only two of the shift registers to the binary adders for each of the pseudo-random patterns being generated. The binary adders generate an output signal that is received by the first shift register. The signal propagates through all the shift registers to the last shift register. The last shift register outputs a pseudo-random sequence.

11 Claims, 3 Drawing Sheets

(56) References Cited

U.S. PATENT DOCUMENTS

| | | | |
|---|---|---|---|
| 6,594,680 B1 | 7/2003 | Gu et al. | |
| 6,714,286 B1 | 3/2004 | Wheel | |
| 10,320,276 B2 * | 6/2019 | Mecklenburg | H02K 41/02 |
| 2004/0179579 A1 * | 9/2004 | Denk | H04B 1/70756 |
| | | | 375/130 |
| 2005/0135621 A1 * | 6/2005 | Burdine | G06F 7/584 |
| | | | 380/265 |
| 2005/0180539 A1 * | 8/2005 | De Gouy | H03K 23/68 |
| | | | 377/47 |
| 2005/0188290 A1 * | 8/2005 | Motika | G01R 31/311 |
| | | | 714/733 |
| 2006/0031745 A1 * | 2/2006 | Kim | H03M 13/118 |
| | | | 714/801 |
| 2007/0273408 A1 * | 11/2007 | Golic | G06F 7/584 |
| | | | 326/93 |
| 2007/0283231 A1 * | 12/2007 | Hoyle | G06F 7/584 |
| | | | 714/781 |
| 2009/0175258 A1 | 7/2009 | Wang et al. | |
| 2019/0265359 A1 | 8/2019 | Datta et al. | |

\* cited by examiner

FIG. 3

| SEQUENCE LENGTH 2^N-1 | SWITCH STATES | | | | | | | | | | | | | | | | | | SPATIAL RESOLUTION | SENSITIVITY | CORRELATION TIME |
|---|---|---|---|---|---|---|---|---|---|---|---|---|---|---|---|---|---|---|---|---|---|
| | S1 | S2 | S3 | S4 | S5 | S6 | S7 | S8 | S9 | S10 | S11 | S12 | S13 | S14 | S15 | S16 | S17 | | | | |
| BYPASS | — | — | — | — | — | — | — | — | — | — | — | — | — | — | — | — | — | | | | |
| N = 3 | Off | On | On | Off | Off | Off | Off | Off | Off | Off | Off | Off | Off | Off | Off | Off | Off | | 1.5 cm | 1 μW | 100 ps |
| N = 4 | Off | Off | On | On | Off | Off | Off | Off | Off | Off | Off | Off | Off | Off | Off | Off | Off | | 11 cm | 140 nW | 700 ps |
| N = 5 | Off | Off | On | Off | On | Off | Off | Off | Off | Off | Off | Off | Off | Off | Off | Off | Off | | 23 cm | 67 nW | 1.5 ns |
| N = 6 | Off | Off | Off | Off | On | On | Off | Off | Off | Off | Off | Off | Off | Off | Off | Off | Off | | 47 cm | 32 nW | 3.1 ns |
| N = 7 | Off | Off | Off | Off | Off | On | On | Off | Off | Off | Off | Off | Off | Off | Off | Off | Off | | 95 cm | 16 nW | 6.3 ns |
| N = 9 | Off | Off | Off | Off | On | Off | Off | Off | On | Off | Off | Off | Off | Off | Off | Off | Off | | 1.9 m | 7.9 nW | 13 ns |
| N = 10 | Off | Off | Off | Off | Off | Off | On | Off | Off | On | Off | Off | Off | Off | Off | Off | Off | | 7.7 m | 1.9 nW | 51 ns |
| N = 11 | Off | Off | Off | Off | Off | Off | Off | Off | On | Off | On | Off | Off | Off | Off | Off | Off | | 15 m | 980 pW | 100 ns |
| N = 15 | Off | Off | Off | Off | Off | Off | Off | Off | Off | Off | On | Off | Off | Off | On | Off | Off | | 31 m | 490 pW | 200 ns |
| N = 17 | Off | Off | Off | Off | Off | Off | Off | Off | Off | Off | On | Off | Off | Off | Off | Off | On | | 490 m | 30 pW | 3.3 μs |
| | | | | | | | | | | | | | | | | | | | 1.9 km | 7.6 pW | 13 μs |

PROGRAMMABLE PSEUDO-RANDOM SEQUENCE GENERATOR FOR USE WITH UNIVERSAL LIDAR AND ITS ASSOCIATED METHOD OF OPERATION

RELATED APPLICATION

This application claims the benefit of U.S. Provisional Patent Application No. 62/845,278, filed May 8, 2019.

GOVERNMENT LICENSE RIGHTS

This invention was made with government support under Contract No. NNX17CL58P awarded by the National Aeronautics and Space Administration (NASA). The government has certain rights to the invention.

BACKGROUND OF THE INVENTION

1. Field of the Invention

In general, the present invention relates to programmable pseudo-random noise generators. More particularly, the present invention is directed to pseudo-random noise generators designed for lidar systems that have adjustable resolution and sensitivity settings.

2. Prior Art Description

Lidar is commonly considered an acronym for "light detection and ranging". Lidar systems are used to illuminate a remote target with a laser beam. The lidar system analyzes the reflected and back-scattered optical signals to determine various properties of the target, such as location, velocity, and material composition. The reflected laser light is received by an array of optical sensors. The optical sensors can vary significantly in their temporal resolution and sensitivity. The sensitivity of the optical sensors is determined by the lowest reflected or back-scattered optical power level that can be detected by the optical sensors.

The sensitivity and resolution required by a lidar system is typically determined by the application. Applications where lidar is used to measure very small Doppler shifts requires a large bandwidth and fine spatial and temporal resolution. Conversely, applications for detecting large Doppler shifts, such as those of detecting weather patterns from space, do not need fine temporal resolution. In the prior art, specialized lidar systems are typically designed for specific applications.

In U.S. Patent Application Publication No. 2019/0265359 to Datta et al., which shares the same applicant, a universal lidar architecture is presented that can be used for a diverse range of applications. This lidar system can utilize ultra-fast components to enable optical pulses of the order of 100 ps. Such a system configuration leads to a very fine spatial resolution of 1.5 cm for the lidar and a sensitivity of 1 pW. This system configuration is useful for short-range applications such as wind tunnel measurements, where the focus is on discerning back-scattered optical signals with high spatial precision, and where the amount of back-scattered light that needs to be detected is relatively high.

The same universal system can also be used for applications such as space-based remote sensing lidars, where the back-scattered light may be received from targets that are thousands of kilometers away from the lidar. Therefore, the emphasis of such lidar systems is on improving the sensitivity to detect very low light levels. This can be accomplished by modulating the optical pulse train with a pseudo-random noise (PRN) sequence, therein significantly increasing the periodicity of the lidar waveform. This proportionally improves the sensitivity of the lidar.

Implementation of a universal lidar system, having a resolution and a sensitivity that can be tuned to the application, therefore, requires a programmable PRN sequence generator. In the prior art, the use of pseudo-random patterns have been used to enhance lidar systems. Such prior art is exemplified by U.S. Pat. No. 6,714,286 to Wheel. However, such prior art systems require the use of a high-speed memory having a size that equals or exceeds the longest pattern length of the pseudo-random patterns being generated. The same problem occurs in implementing pseudo-random patterns into continuous wave radars, as shown by U.S. Pat. No. 5,519,736 to Isheda. Using such prior art systems, the implementation of PRN patterns with a periodicity of up to $2^{17}-1$ with 100 ps bit period would require at least a 10 GHz, 128 Kbit programmable memory. The need for large memory storage increases costs and processing requirements.

A need therefore exists in the art for a system that can utilize pseudo-random patterns to tune the resolution and sensitivity of a lidar system without requiring large memory usage. This need is met by the present invention as described and claimed below.

SUMMARY OF THE INVENTION

The present invention is a pseudo-random sequence generator and its corresponding method of operation. The pseudo-random sequence generator is used in association with a universal lidar system to enable the lidar system to quickly switch between scan patterns and to change operating range and resolution. The pseudo-random sequence generator uses a clock signal to synchronize a plurality of shift registers. The shift registers are arranged in series between a first shift register and a last shift register. Each shift register has a signal input and a signal output. With the exception of the last shift register, the signal output of each shift register leads to the signal input of the next shift register.

A plurality of binary adders are provided. The signal output of each of the shift registers is tapped and directed to the binary adders. High-speed switches are provided between the shift registers and the binary adders. The switches are programmed to connect only two of the shift registers to the binary adders for each of the pseudo-random patterns being generated.

The binary adders generate an output signal that is received by the first shift register. The signal propagates through all the shift registers to the last shift register. The last shift register outputs a pseudo-random sequence.

BRIEF DESCRIPTION OF THE DRAWINGS

For a better understanding of the present invention, reference is made to the following description of an exemplary embodiment thereof, considered in conjunction with the accompanying drawings, in which:

FIG. 3 is a table showing the programmable states of the exemplary circuit of FIG. 1 with corresponding spatial resolution, sensitivity and correlation time values for the programmable states.

DETAILED DESCRIPTION OF THE DRAWINGS

The present invention is a pseudo-random noise (PRN) sequence generator that is particularly well suited for use with universal lidar systems. Accordingly, the exemplary embodiment selected to be illustrated and described references the PRN sequence generator operating within the context of a lidar system. The exemplary embodiment is selected in order to set forth one of the best modes contemplated for the invention. The illustrated embodiment, however, is merely exemplary and should not be considered a limitation when interpreting the scope of the claims.

The present invention is an improved programmable PRN sequence generator that uses a linear feedback shift register architecture. The PRN sequence generator produces a pseudo-random pattern. The pseudo-random pattern is a deterministic, periodic bit stream having an impulsive autocorrelation function that resembles noise. Such a pseudo-random pattern is particularly useful for enhancing the sensitivity and resolution of lidar systems. The pseudo-random pattern enables the lidar system to better switch between scan patterns while changing both range and sensitivity. In the prior art, the generation of such pseudo-random patterns requires the use of a high-speed memory. The capacity of the memory must equal or exceed the longest pattern length within the pseudo-random patterns being generated. The PRN sequence generator presented generates useful pseudo-random patterns without the need or use of memory.

Figure 1:
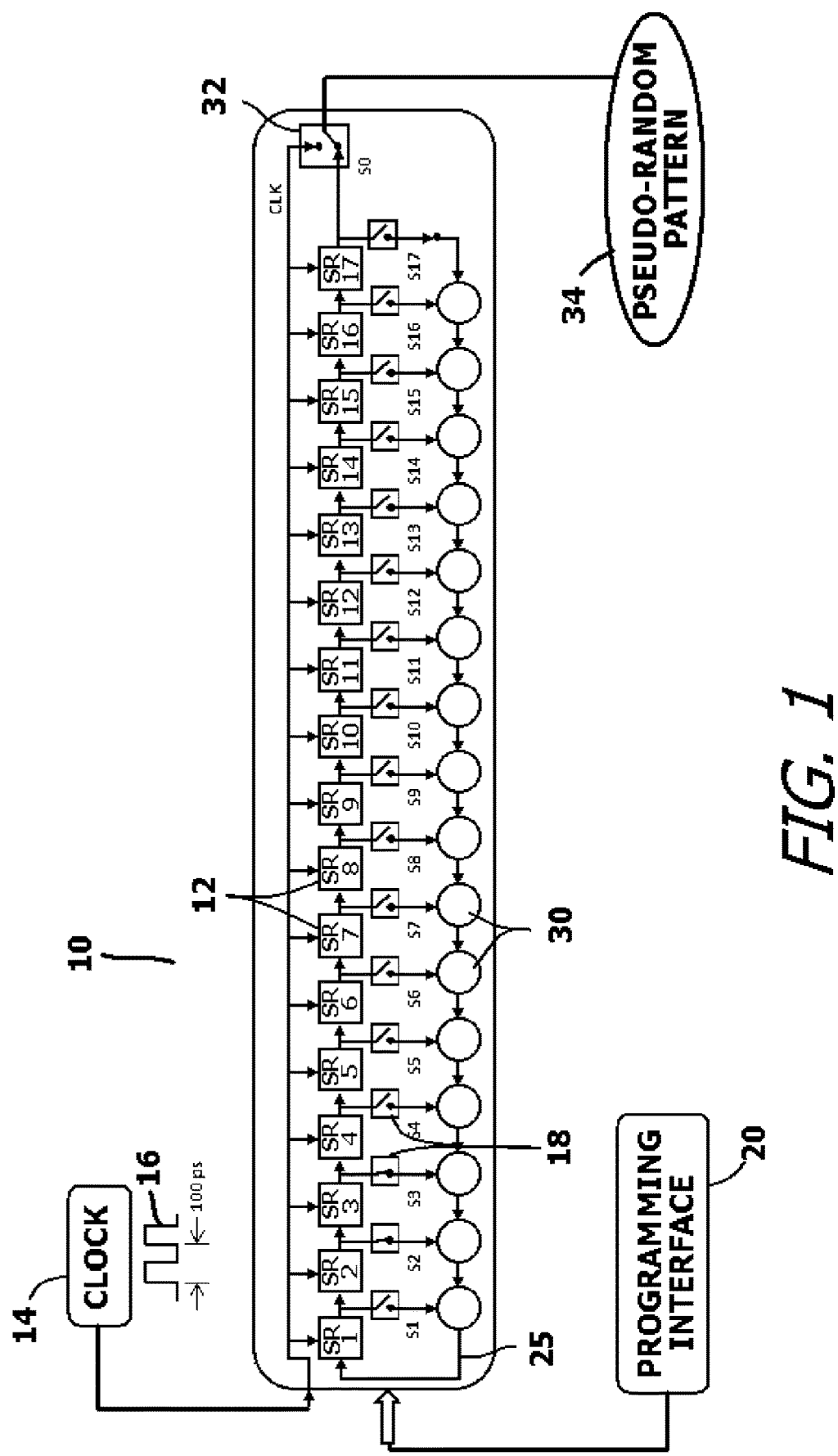
FIG. 1 is a schematic for a pseudo-random sequence generator circuit in accordance with the present invention.
Figure 2:
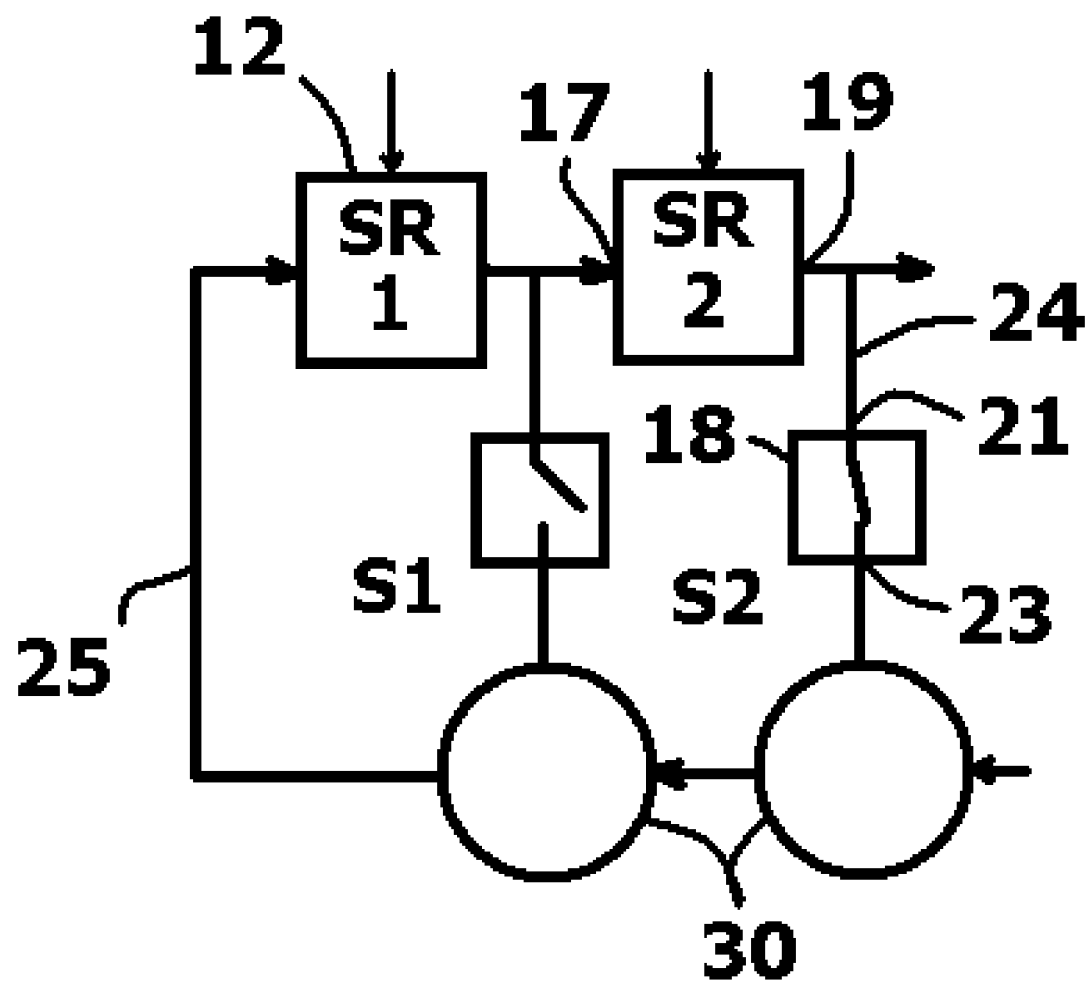
FIG. 2 is an enlarged section of the circuit shown in FIG. 1.

Referring to FIG. 1 and FIG. 2, an exemplary circuit of a PRN sequence generator 10 is shown. The PRN sequence generator 10 utilizes a single linear feedback shift register to implement multiple PRN sequences. The multiple PRN sequences in the shown embodiment can have sequence lengths of up to $2^{17}-1$. The shown programmable PRN sequence generator 10 generates ten different PRN sequences with a periodicity of up to $2^{17}-1$ and enables a bypass mode. This sequence length is particularly useful in operation of a universal lidar system in that it can match the scan patterns of the system.

The PRN sequence generator 10 includes seventeen shift registers 12. The shift registers 12 are arranged in a daisy chain configuration. In FIG. 1, the seventeen shift registers 12 are individually indicated with identifiers SR1 through SR17. The shift registers 12 are controlled by an external clock 14. The external clock 14 provides a clock signal 16 that is received by each of the shift registers 12. Preferably, the clock signal 16 is a 10 GHz clock for the given configuration. However, it should be understood that different applications can utilize different clock signal frequencies.

Each shift register 12 has a signal input 17 and a signal output 19. With the exception of the first shift register SR1, the signal input 17 of each shift register 12 receives the signal output 19 of the prior shift register 12. That is, the signal input 17 of the second shift register SR2 receives the signal output 19 of the first shift register SR1. The signal input 17 of the third shift register SR3 receives the signal output 17 of the second shift register SR2. This pattern continues to the seventeenth shift register SR17.

A plurality of high-speed switches 18 are provided. Each of the high-speed switches 18 has an input 21 and an output 23. One digital high-speed switch 18 is provided to each of the shift registers 12. The digital high-speed switches 18 each have a switch speed that matches or surpasses the frequency of the clock signal 16. In the shown embodiment, seventeen shift registers 12 are shown. As such, seventeen high-speed switches 18 are provided for the seventeen shift registers 12. In the illustrations, the high-speed switches 18 are individually referenced with the identifiers S1 through S17. The signal output 19 of each of the shift registers 12 is tapped, therein creating a tapped output signal 24. The tapped output signal 24 from each of the shift registers 12 is fed to the input 21 of a corresponding high-speed switch 18. The high-speed switches 18 operate in either an open state or a closed state. In the closed state, the signal output 19 from the shift register 12 passes through to the output 23 of the corresponding high-speed switch 18. In an open state, the signal output 19 from the shift register 12 is blocked.

In the illustrated embodiment, the second high-speed switch S2 and the third high-speed switch S3 are shown in the closed state. The remaining fifteen high-speed switches S1 and S4-S17 are shown in an open state. The state of the high-speed switches 18 determines the specific PRN sequences being generated and are optimized to obtain impulsive autocorrelation. For all PRN sequences generated by the PRN sequence generator 10, the number of high-speed switches 18 set to a closed state is always restricted to two. That is, only two of the high-speed switches 18 are in a closed state for each PRN sequence generated. This greatly simplifies synchronization of the clock signal 16 and the implementation into a lidar system. This also minimizes changes in switch settings, i.e. tap locations, between neighboring states to enable smooth transition between sequences without losing synchronization with the clock signal 16. The switch states of the high-speed switches 18 are controlled by programming. The programming is entered via an external programming interface 20, such as an I2C or an SPI interface.

An array of binary adders 30 is provided. The binary adders 30 can be full adders, ripple-carry adders, carry-lookahead adders, carry-same adders or the like. The number of binary adders 30 in the array corresponds to both the number of shift registers 12 and the number of high-speed switches 18. The outputs 23 of the high-speed switches 18 lead to the binary adders 30. The binary adders 30 connect to the signal input 17 of the first shift register SR1. In this manner, the binary adders 30 provide feedback to the start of the daisy chain configuration of the shift registers 12, via a feedback loop 25.

A double-pole, high-speed switch 32 is provided at the end of the daisy chain of shift registers 12. As such, the double-pole, high-speed switch 32 receives the signal output 19 of the last high-speed switch (S17) of the shift registers 12. The double-pole, high-speed switch 32 also receives the clock signal 16. The double-pole, high-speed switch 32 has the ability to select the output of the PRN sequence generator 10 to be either a PRN pattern of chosen periodicity or the frequency of the clock signal 16. The frequency of the clock signal 16 is selected in a bypass mode of operation.

When not in bypass mode, a pseudo-random pattern 34 passes through the double-pole, high-speed switch 32. The pseudo-random pattern 34 is the output of the last shift register (SR17) of the seventeen shift registers 12. The pseudo-random pattern 34 has a periodicity of $2^N-1$, where N=3, 4, 5, 6, 7, 9, 10, 11, 15, or 17 depending on the switch states of the high-speed switches 18.

Referring to FIG. 3 in conjunction with FIG. 1, a switch state table 40 for the high-speed switches 18 is shown. The table 40 shows how the PRN sequence generator 10 is programmed to produce various pseudo-random patterns 34 and the bypass mode 36. In FIG. 3, the seventeen high-speed switches 18 of FIG. 1 are indicated by the identifiers S1 through S17. Each of the high-speed switches 18 is programmed to have either an open state or a closed state. FIG. 3 also displays a spatial resolution column 42, a sensitivity column 44, and a correlation time column 46, that show the effects of the pseudo-random patterns 34 on an exemplary lidar system. The exemplary lidar system is the system disclosed in U.S. Patent Application Publication No. 2019/0265359 to Datta et al., the disclosure of which is herein incorporated by reference.

In the switch state table 40, a maximal length sequence (M-Sequence) from several classes of pseudo-random patterns 34 have been selected for ease of implementation. Typical implementation of an M-sequence of length $2^N-1$ utilizes an N-element shift register driving N−1 element adder arrays with the signal tap configuration and feedback loop previously described. It should be noted that only specific combinations of open and closed high-speed switches, defined by the sequence generator polynomial, leads to a noise-like autocorrelation function.

In an alternate embodiment, a programmable system architecture can be implemented using multiple PRN generators, of which only one is activated in a given time, depending on the target specifications. This effects the scalability and sensitivity of a lidar system. Such an architecture would require additional programmed controls for synchronization since the pseudo-random patterns are changed while tuning the resolution and sensitivity of the lidar system.

It will be understood that the embodiment of the present invention that is illustrated and described is merely exemplary and that a person skilled in the art can make many variations to that embodiment. All such embodiments are intended to be included within the scope of the present invention as defined by the claims.

What is claimed is:

1. A pseudo-random sequence generator for use in a universal lidar system, said pseudo-random sequence generator, comprising:
    a clock that produces a clock signal at a signal frequency;
    a plurality of shift registers arranged in series between a first shift register and a last shift register, wherein said shift registers receive said clock signal and produce signal outputs;
    a plurality of switches that correspond in number to said plurality of shift registers and said signal outputs, wherein said plurality of switches receive said signal outputs from said shift registers, and wherein each of said plurality of switches can be selectively altered between an open state and a closed state;
    a programming interface for selectively altering said plurality of switches between said open state and said closed state, and wherein said programming interface limits said plurality of switches in said closed state at any time to two;
    a plurality of binary adders that receive said signal outputs through any of said plurality of switches in said open state, wherein said plurality of binary adders generate an output signal that is received by said first shift register;
    wherein said last shift register outputs a pseudo-random sequence; and
    a double pole switch that receives said clock signal and said pseudo-random sequence from said last shift register, wherein said double pole switch can switch between said pseudo-random sequence and said clock signal to produce an output signal that is either a pseudorandom pattern of a selected periodicity or said signal frequency of said clock.

2. The pseudo-random sequence generator according to claim 1, wherein said plurality of binary adders correspond in number to said plurality of switches.

3. The pseudo-random sequence generator according to claim 1, wherein each said plurality of switches has a switch speed that is at least as high as said signal frequency of said clock signal.

4. A pseudo-random sequence generator for use in a lidar system, comprising:
    a clock that produces a clock signal at a signal frequency;
    shift registers, synchronized by said clock signal, that arranged in series between a first shift register and a last shift register, wherein each of said shift registers have a signal input and a signal output;
    binary adders;
    switches connected between said signal input of each of said shift registers and said binary adders, wherein each of said switches can be selectively altered between an open state and a closed state;
    a programming interface for selectively altering said switches between said open state and said closed state, and wherein said programming interface limits said plurality of switches in said closed state at any time to two;
    wherein said binary adders generate an output signal that is received by said first shift register, and wherein said last shift register outputs a pseudo-random sequence.

5. The pseudo-random sequence generator according to claim 4, wherein said switches correspond in number to said shift registers.

6. The pseudo-random sequence generator according to claim 5, wherein said binary adders correspond in number to said switches.

7. The pseudo-random sequence generator according to claim 4, further including a double pole switch that receives said clock signal and said pseudo- random sequence from said last shift register, wherein said double pole switch can switch between said pseudo-random sequence and said clock signal.

8. The pseudo-random sequence generator according to claim 4, wherein each of said switches has a switch speed that is at least as high as said signal frequency of said clock signal.

9. A method of generating a pseudo-random sequence for use in a universal lidar system, said method comprising the steps of:
    generating a clock signal having a signal frequency;
    providing a plurality of shift registers that are arranged in series between a first shift register and a last shift register, wherein each of said shift registers has a signal input and a signal output;
    synchronizing said plurality of shift registers to said clock signal;
    providing binary adders that are connected to said signal input of said first shift register;
    using switches to selectively connect said signal input of only two of said plurality of shift registers to said binary adders, wherein said binary adders generate an output signal that is received by said first shift register, and wherein said last shift register outputs a pseudo-random sequence;

a double pole switch that receives said clock signal and said pseudo-random sequence from said last shift register, wherein said double pole switch can switch between said pseudo-random sequence and said clock signal to produce an output signal that is either a pseudorandom pattern of a selected periodicity or said signal frequency of said clock.

10. The method according to claim 9, wherein said switches correspond in number to said plurality of shift registers.

11. The method according to claim 10, wherein said binary adders correspond in number to said switches.

* * * * *